(12) United States Patent
Lassa et al.

(10) Patent No.: US 9,141,308 B2
(45) Date of Patent: Sep. 22, 2015

(54) CONTROLLER AND METHOD FOR USING A TRANSACTION FLAG FOR PAGE PROTECTION

(75) Inventors: Paul A. Lassa, Cupertino, CA (US); Robert D. Selinger, San Jose, CA (US); Alan W. Sinclair, Falkirk (GB)

(73) Assignee: SanDisk Technologies Inc., Plano, TX (US)

( * ) Notice: Subject to any disclaimer, the term of this patent is extended or adjusted under 35 U.S.C. 154(b) by 39 days.

(21) Appl. No.: 13/341,579

(22) Filed: Dec. 30, 2011

(65) Prior Publication Data

US 2013/0173848 A1 Jul. 4, 2013

(51) Int. Cl.
G06F 12/00 (2006.01)
G06F 3/06 (2006.01)
G06F 11/10 (2006.01)
G11C 29/04 (2006.01)

(52) U.S. Cl.
CPC ............. *G06F 3/0688* (2013.01); *G06F 3/065* (2013.01); *G06F 3/0619* (2013.01); *G06F 11/1072* (2013.01); *G11C 29/04* (2013.01)

(58) Field of Classification Search
CPC ............................ G06F 11/1072; G11C 29/04
See application file for complete search history.

(56) References Cited

U.S. PATENT DOCUMENTS

| | | | |
|---|---|---|---|
| 6,988,175 B2 | 1/2006 | Lasser | |
| 7,178,061 B2 | 2/2007 | Aasheim et al. | |
| 7,299,314 B2 | 11/2007 | Lin et al. | |
| 7,366,029 B2 | 4/2008 | Kagan | |
| 7,631,245 B2 | 12/2009 | Lasser | |
| 2009/0070529 A1* | 3/2009 | Mee et al. | 711/114 |
| 2009/0187700 A1 | 7/2009 | Kern et al. | |
| 2010/0023800 A1 | 1/2010 | Harari et al. | |
| 2010/0042772 A1* | 2/2010 | Bonella et al. | 711/103 |
| 2010/0318839 A1* | 12/2010 | Avila et al. | 714/5 |
| 2011/0040924 A1 | 2/2011 | Selinger | |
| 2011/0041005 A1 | 2/2011 | Selinger | |
| 2011/0041039 A1* | 2/2011 | Harari et al. | 714/773 |
| 2011/0161554 A1 | 6/2011 | Selinger et al. | |
| 2011/0161784 A1 | 6/2011 | Selinger et al. | |
| 2012/0030412 A1 | 2/2012 | Dhakshinamurthy et al. | |
| 2012/0054582 A1* | 3/2012 | Byom et al. | 714/773 |
| 2012/0063231 A1* | 3/2012 | Wood et al. | 365/185.18 |
| 2012/0159058 A1* | 6/2012 | Yonezawa et al. | 711/104 |

\* cited by examiner

*Primary Examiner* — Charles Rones
*Assistant Examiner* — Tian-Pong Chang
(74) *Attorney, Agent, or Firm* — Brinks Gilson & Lione

(57) ABSTRACT

A controller is presented having one or more interfaces through which to communicate with a plurality of memory dies with multi-level memory cells and an interface through which to communicate with a host. The controller also contains a processor that is configured to receive a command from the host to program data in a plurality of lower pages and a plurality of upper pages of the multi-level memory cells. The controller detects an indication from the host that indicates which previously-programmed lower pages from a previous program command are at risk of being corrupted by the programming of the upper pages from the received program command. Prior to programming the upper pages, the controller backs up the previously-programmed lower pages from the previous program command that are at risk of being corrupted but not the lower pages of data programmed by the received program command.

20 Claims, 10 Drawing Sheets

| X1 memory cell |
|---|
| 1 |
| 0 |

FIG. 6A

| X2 memory cell |
|---|
| 11 |
| 10 |
| 01 |
| 00 |

FIG. 6B

| X3 memory cell |
|---|
| 111 |
| 110 |
| 101 |
| 100 |
| 011 |
| 010 |
| 001 |
| 000 |

FIG. 6C

MLC Physical U/L Page Programming Order - over WLs

| Upper Pages: | Page 4 | Page 6 | Page 8 | Page 10 | Page 12 | Page 14 |
|---|---|---|---|---|---|---|
| Lower Pages: | Page 1 | Page 3 | Page 5 | Page 7 | Page 9 | Page 11 |
| | WL 1 | WL 2 | WL 3 | WL 4 | WL 5 | WL 6 |

| ... | Cmd 1: Prog (pages 4,5,6,7) | | | | Cmd 2: Prog (pages 8,9,10,11) | | | | ... |
|---|---|---|---|---|---|---|---|---|---|
| Page 3 | Page 4 | Page 5 | Page 6 | Page 7 | Page 8 | Page 9 | Page 10 | Page 11 | Page 12 |
| L | U | L | U | L | U | L | U | L | U |

Lower Pages (5,7) from previous Cmd1 are vulnerable when later Programming Upper Pages (8 & 10) with Cmd 2

| ... | Cmd 1: Prog (pages 4,5,6,7) | | | | Cmd 2: Prog (pages 8,9,10,11) | | | | ... |
|---|---|---|---|---|---|---|---|---|---|
| Page 3 | Page 4 | Page 5 | Page 6 | Page 7 | Page 8 | Page 9 | Page 10 | Page 11 | Page 12 |
| L | U | L | U | L | U | L | U | L | U |
| 0 | TB | TB | TB | 0 | TB | TB | TB | 0 | ? |

Vulnerable Page Duration = 3 TB's for X2 memory

FIG. 10

Physical L/U Page Programming Order - over WLs

| | | | | | | |
|---|---|---|---|---|---|---|
| Upper Pages: | Page 4 | Page 6 | Page 8 | Page 10 | Page 12 | Page 14 |
| Lower Pages: | Page 1 | Page 3 | Page 5 | Page 7 | Page 9 | Page 11 |
| | WL 1 | WL 2 | WL 3 | WL 4 | WL 5 | WL 6 |

| Page 2 | Page 4 | Page 5 | Page 6 | Page 8 | Page 9 | Page 10 | Page 12 | Page 13 | Page 14 | ... | Page 16 | Page 17 |
|---|---|---|---|---|---|---|---|---|---|---|---|---|
| U | L | M | U | L | M | U | L | M | U | | L | M |
| ? | TB | TB | TB | TB | TB | TB | TB | TB | 0 | | | |

Cmd 1: Prog (pages 4,5,6)  Cmd 2: Prog (pages 8,9,10,12,13,14)

Vulnerable Page Duration = up to 7 TB's for X3 memory

FIG. 13

Physical L/M/U Page Programming Order - over WLs

| | | | | | | | |
|---|---|---|---|---|---|---|---|
| Upper Pages: | Page 2 | Page 6 | Page 10 | Page 14 | Page 18 | Page 22 | Page 26 |
| Middle Pages: | Page 1 | Page 5 | Page 9 | Page 13 | Page 17 | Page 21 | Page 25 |
| Lower Pages: | Page 0 | Page 4 | Page 8 | Page 12 | Page 16 | Page 20 | Page 24 |
| | WL 1 | WL 2 | WL 3 | WL 4 | WL 5 | WL 6 | WL |

CONTROLLER AND METHOD FOR USING A TRANSACTION FLAG FOR PAGE PROTECTION

BACKGROUND

A solid state drive (SSD) is designed to provide reliable and high performance storage of user data across a flash-based memory system containing a host interface controller (such as a Serial Advanced Technology Attachment (SATA) interface) and a number of memory multi-chip packages (MCPs), where each MCP contains a stack of NAND flash dies and, optionally, a flash memory controller. The Open NAND Flash Interface (ONFI) protocol provides support for parallel access to multiple NAND dies (or "logical units" (LUNs)) on a single "target" or NAND multi-chip stack on a single shared ONFI channel. In a typical SATA-based SSD application, a central host controller accesses multiple attached devices (targets/NAND device clusters) on each ONFI channel, and across several ONFI channels. (A typical host controller would include a SATA interface and four, eight, or more flash interface channels. These channels may utilize a standard flash interface protocol, such as ONFI.) Each ONFI target typically controls 2, 4, or 8 NAND dies.

Some SSDs have flash storage capable of storing one bit per memory cell (i.e., single level cells (SLCs)) or multiple bits per memory cell (i.e., multi-level cells (MLCs)). Examples of MLCs include X2 technology (two bits per cell) and X3 technology (three bits per cell). There can be programming challenges when writing multiple bits per cells, and it is desired that SSDs ensure reliable storage of user data despite these challenges.

SUMMARY

The present invention is defined by the claims, and nothing in this section should be taken as a limitation on those claims.

By way of introduction, the embodiments described below provide a controller and method for using a transaction flag for page protection. In one embodiment, a controller is presented having one or more interfaces through which to communicate with a plurality of memory dies and an interface through which to communicate with a host. At least some of the plurality of memory dies contain multi-level memory cells operative to be programmed with at least two bits of data. The controller also contains a processor that is configured to receive a command from the host to program data in a plurality of lower pages and a plurality of upper pages of the multi-level memory cells. The controller detects an indication from the host that indicates which previously-programmed lower pages from a previous program command are at risk of being corrupted by the programming of the upper pages from the received program command. Prior to programming the upper pages, the controller backs up the previously-programmed lower pages from the previous program command that are at risk of being corrupted but not the lower pages of data programmed by the received program command.

Other embodiments are disclosed, and each of the embodiments can be used alone or together in combination. The embodiments will now be described with reference to the attached drawings.

BRIEF DESCRIPTION OF THE DRAWINGS

FIGS. 6A, 6B, and 6C are diagrams illustrating programming of X1, X2, and X3 memory cells

FIG. 10 is an illustration of how a transaction flag can be used for page protection in X2 memory.

FIG. 11 is an illustration of upper and lower page programming over word lines of an embodiment.

FIG. 12 is an illustration of how a transaction flag can be used for page protection in X3 memory.

FIG. 13 is an illustration of upper, middle, and lower page programming over word lines of an embodiment.

DETAILED DESCRIPTION OF THE PRESENTLY PREFERRED EMBODIMENTS

Introduction

The following embodiments relate generally to a controller and method for using a transaction flag for page protection. In general, these embodiments can be used to protect and manage vulnerable data in multi-level cell memory devices. Multi-level cells are typically programmed in a number of pages. For example, in X2 memory, lower pages of data are programmed, and then upper pages of data are programmed. Because of the nature of the memory cells, programming of upper pages can corrupt some previously-programmed lower pages. To ensure that the data stored in the previously-programmed lower pages is not lost if those pages are later corrupted, some host devices will read out of the storage device all of the lower pages that have been programmed and store the data from these pages in a buffer. That way, if any of the lower pages are corrupted by the programming of the upper pages, the data from the corrupted lower pages can be retrieved from the buffer and stored in another location in the storage device. While such a "brute force" method ensures against the loss of data, this method may be very inefficient and needlessly use bandwidth between the host and the storage device, as not all of the lower pages may be vulnerable to corruption. Also, the data from a current programming transaction is typically already stored in the host buffer as part of the write process, so that data does not need to be stored again. With these embodiments, the host provides the storage device's controller with knowledge of the programming transaction, which the controller can use to more efficiently backup of at-risk data.

Before turning to the details of these embodiments, the following section discusses exemplary architectures.

Exemplary Architectures

Figure 1:
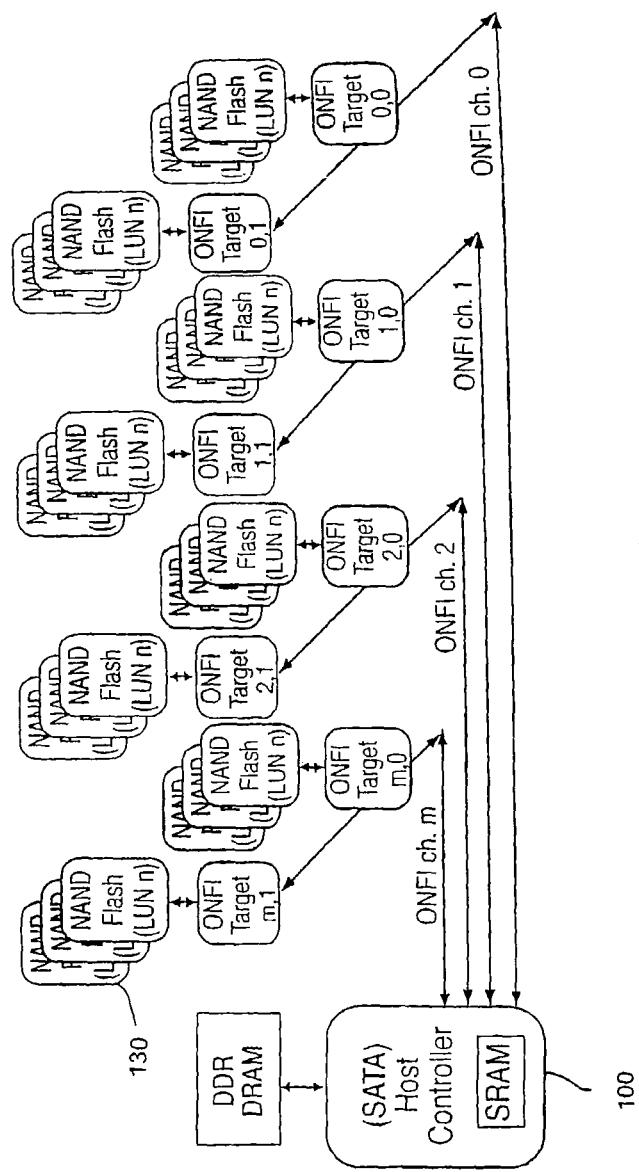
FIG. 1 is a block diagram of a memory system of an embodiment.

Turning now to the drawings, FIG. 1 is a block diagram of a memory system of an embodiment. As shown in FIG. 1, a host controller 100 is in communication with a plurality of multi-chip memory packages via one or more interfaces (here, ONFI channels). (As used herein, the phrase "in communication with" means directly in communication with or indirectly in communication with through one or more components, which may or may not be shown or described herein.) Here, the controller 100 accesses (on each ONFI channel and across several ONFI channels) multiple attached ONFI targets. Each multi-chip memory package (called a "target" in FIG. 1) comprises a plurality of memory dies (NAND Flash LUNs) and, optionally, a local MCP controller (not shown). The controller 100 also has a processor configured to perform various actions, which will be described in detail below. The controller 100 can have on-board memory (e.g., SRAM) and/or external memory (e.g., DDR DRAM) to store executable program code (software or firmware) and other user data and system control data or structures used in its operations. In one embodiment, the memory system is part of a solid-state drive (SSD), and, in another embodiment, the controller 100 is used in OEM designs that use a Southbridge controller to interface to flash memory devices. Of course, these are merely examples, and other implementations can be used.

As mentioned above, controller 100 is a host controller. A "host" is any entity that is capable of accessing the one or more flash memory device(s) through the controller 100, either directly or indirectly through one or more components named or unnamed herein. A host can take any suitable form, such as, but not limited to, a personal computer, a mobile phone, a game device, a personal digital assistant (PDA), an email/text messaging device, a digital camera, a digital media (e.g., MP3) player, a GPS navigation device, a personal navigation system (PND), a mobile Internet device (MID), and a TV system. Depending on the application, the host can take the form of a hardware device, a software application, or a combination of hardware and software.

Also, "flash memory device(s)" refer to device(s) containing a plurality of flash memory cells and any necessary control circuitry for storing data within the flash memory cells. In one embodiment, the flash memory cells are NAND memory cells, although other memory technologies, such as passive element arrays, including one-time programmable memory elements and/or rewritable memory elements, can be used. (It should be noted that, in these embodiments, a non-NAND-type flash memory device can still use a NAND interface and/or NAND commands and protocols.) Also, a flash memory device can be a single memory die or multiple memory dies. Accordingly, the phrase "a flash memory device" used in the claims can refer to only one flash memory device or more than one flash memory device.

Figure 2:
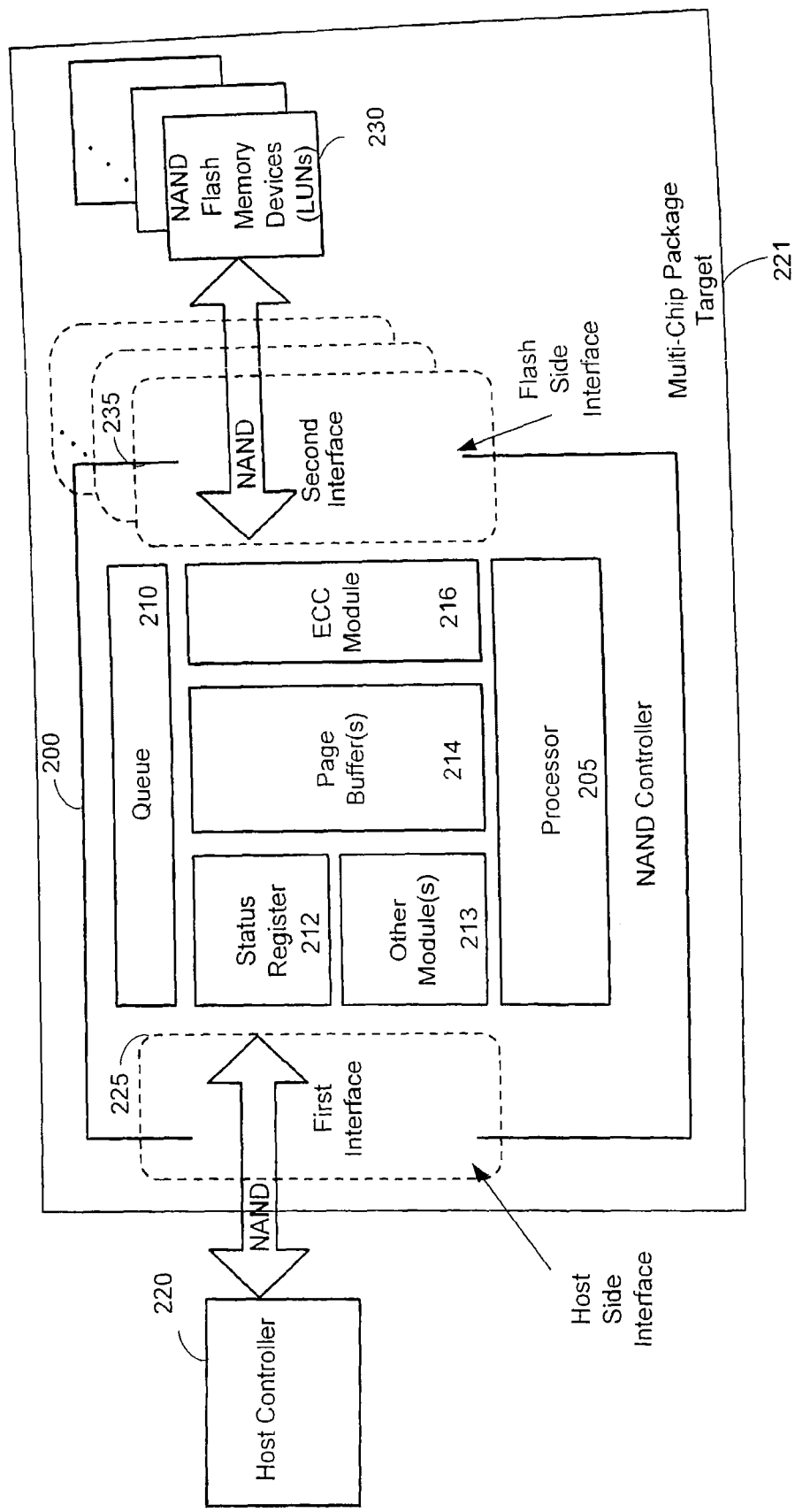
FIG. 2 is a block diagram of a multi-chip package of an embodiment.

Returning to the drawings, FIG. 2 illustrates a "target" multi-chip package 221 and a host controller 220 of an embodiment. As shown in FIG. 2, the multi-chip package 221 has a NAND controller 200 having a processor 205, a queue (memory) 210, one or more status registers 212, one or more other module(s) 213, one or more page buffers 214, and an error correction code (ECC) module 216. (The NAND controller 200 can contain other components, which are not shown in FIG. 2 to simplify the drawing.) As used herein, a "module" can include hardware, software, firmware, or any combination thereof. Examples of forms that a "module" can take include, but are not limited to, one or more of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. The "other module(s) 213" can perform any desired function(s), such as, but not limited to, data scrambling, column replacement, handling write aborts and/or program failures (via safe zones), read scrubbing, wear leveling, bad block and/or spare block management, error detection code (EDC) functionality, status functionality, encryption functionality, error recovery, and address mapping (e.g., mapping of logical to physical blocks). Further information about these various functions is described in U.S. patent application Ser. Nos. 12/539,394; 12/539,407; 12/539,379; 12/650,263; 12/650,255; and 12/539,417, which are hereby incorporated by reference.

While the NAND controller 200 and flash memory device(s) 230 are shown as two separate boxes, it should be understood that the NAND controller 200 and flash memory device(s) 230 can be arranged in any suitable manner (e.g., packaged in different packages, packaged within a common multi-chip package, and or integrated on a same die). In any of these arrangements, the controller can be physically located separately from the host controller 220. This allows the controller and flash memory device(s) to be considered a separate circuitry unit, which can be used with a wide variety of host controllers 220.

The NAND controller 200 communicates with the host controller 220 using a first interface 225 and communicates with the flash memory device(s) 230 using second interface(s) 235. The first and second interfaces can be NAND interfaces operating under NAND interface protocols. Examples of NAND interfaces include, but are not limited to, Open NAND Flash Interface (ONFI), toggle mode (TM), and a high-performance flash memory interface, such as the one described in U.S. Pat. No. 7,366,029, which is hereby incorporated by reference. The NAND controller 200 may optionally include one or more additional host-side interfaces, for interfacing the NAND controller 200 to hosts using non-NAND interfaces, such as SD, USB, SATA, or MMC interfaces. Also, the interfaces 225, 235 can use the same or different NAND interface protocols.

In general, a NAND interface protocol is used to coordinate commands and data transfers between a NAND flash device and a host using, for example, data lines and control signals, such as ALE (Address Latch Enable), CLE (Command Latch Enable), and WE# (Write Enable). Even though the term "NAND interface protocol" has not, to date, been formally standardized by a standardization body, the manufacturers of NAND flash devices all follow very similar protocols for supporting the basic subset of NAND flash functionality. This is done so that customers using NAND devices within their electronic products could use NAND devices from any manufacturer without having to tailor their hardware or software for operating with the devices of a specific vendor. It is noted that even NAND vendors that provide extra functionality beyond this basic subset of functionality ensure that the basic functionality is provided in order to provide compatibility with the protocol used by the other vendors, at least to some extent.

A given device (e.g., a controller, a flash memory device, a host, etc.) is said to comprise, include, or have a "NAND interface" if the given device includes elements (e.g., hardware, software, firmware, or any combination thereof) necessary for supporting the NAND interface protocol (e.g., for interacting with another device using a NAND interface protocol). (As used herein, the term "interface(s)" can refer to a single interface or multiple interfaces. Accordingly, the term "interface" in the claims can refer to only one interface or more than one interface.) In this application, the term "NAND Interface protocol" (or "NAND interface" in short) refers to an interface protocol between an initiating device and a responding device that, in general, follows the protocol between a host and a NAND flash device for the basic read, write, and erase operations, even if it is not fully compatible with all timing parameters, not fully compatible with respect to other commands supported by NAND devices, or contains additional commands not supported by NAND devices. One suitable example of a NAND interface protocol is an interface protocol that uses sequences of transferred bytes equivalent in functionality to the sequences of bytes used when interfacing with a Toshiba TC58NVG1S3B NAND device (or a Toshiba TC58NVG2D4B NAND device) for reading (opcode 00H), writing (opcode 80H), and erasing (opcode 60H), and also uses control signals equivalent in functionality to the CLE, ALE, CE, WE, and RE signals of the above NAND device.

It is noted that a NAND interface protocol is not symmetric in that the host—not the flash device—initiates the interaction over a NAND interface. Further, an interface (e.g., a NAND interface or an interface associated with another protocol) of a given device (e.g., a controller) may be a "host-side interface" (e.g., the given device is adapted to interact with a host using the host-side interface), or the interface of the given device may be a "flash memory device-side interface" (e.g., the given device is adapted to interact with a flash memory device using the flash memory device-side interface). The terms "flash memory device-side interface," "flash device-side interface," and "flash-side interface" are used interchangeably herein.

These terms (i.e., "host-side interface" and "flash device-side interface") should not be confused with the terms "host-type interface" and "flash-type interface," which are terminology used herein to differentiate between the two sides of a NAND interface protocol, as this protocol is not symmetric. Furthermore, because it is the host that initiates the interaction, we note that a given device is said to have a "host-type interface" if the device includes the necessary hardware and/or software for implementing the host side of the NAND interface protocol (i.e., for presenting a NAND host and initiating the NAND protocol interaction). Similarly, because the flash device does not initiate the interaction, we note that a given device is said to have a "flash-type interface" if the device includes the necessary hardware and/or software for implementing the flash side of the NAND protocol (i.e., for presenting a NAND flash device).

Typically, "host-type interfaces" (i.e., those which play the role of the host) are "flash device-side interfaces" (i.e., they interact with flash devices or with hardware emulating a flash device) while "flash device-type interfaces" (i.e., those which play the role of the flash device) are typically "host-side interfaces" (i.e., they interact with hosts or with hardware emulating a host).

Additional information about exemplary controllers (and their advantages over prior controllers) can be found in U.S. Pat. No. 7,631,245 and U.S. patent application Ser. Nos. 12/539,394; 12/539,407; 12/539,379; 12/650,263; 12/650,255; and 12/539,417, which are hereby incorporated by reference.

Figure 3:
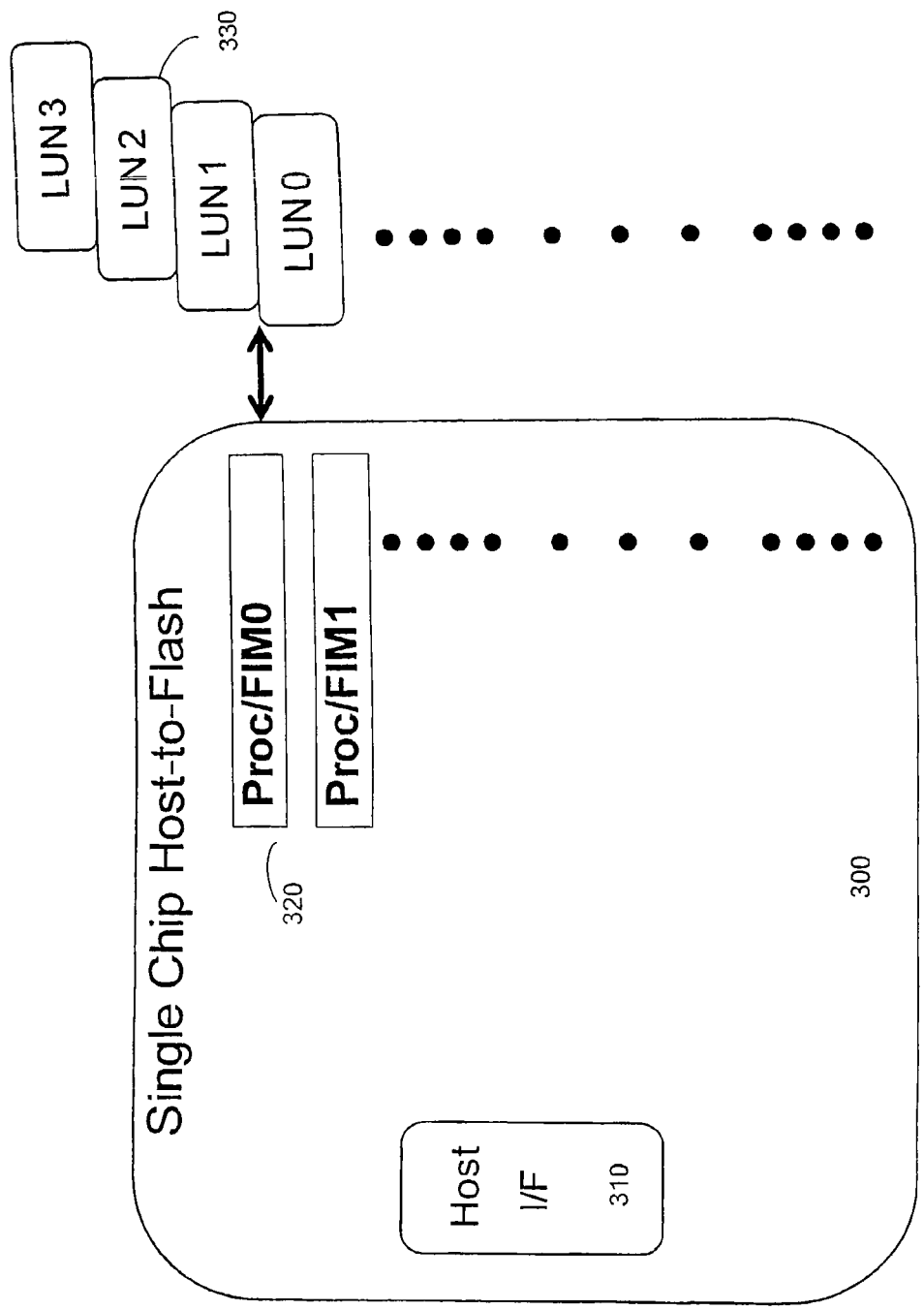
FIG. 3 is a block diagram of an architecture of an embodiment.
Figure 4:
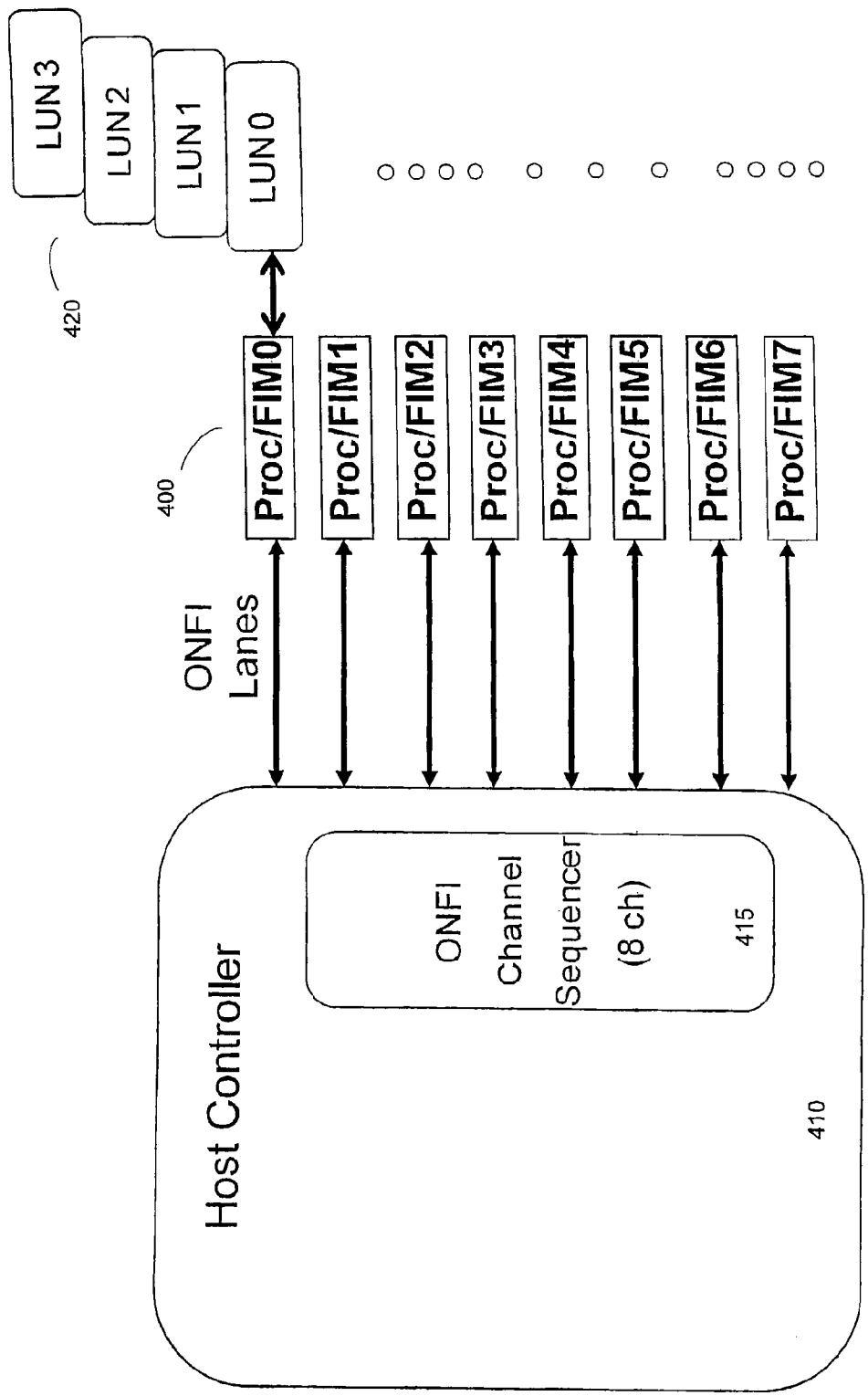
FIG. 4 is a block diagram of an architecture of an embodiment.
Figure 5:
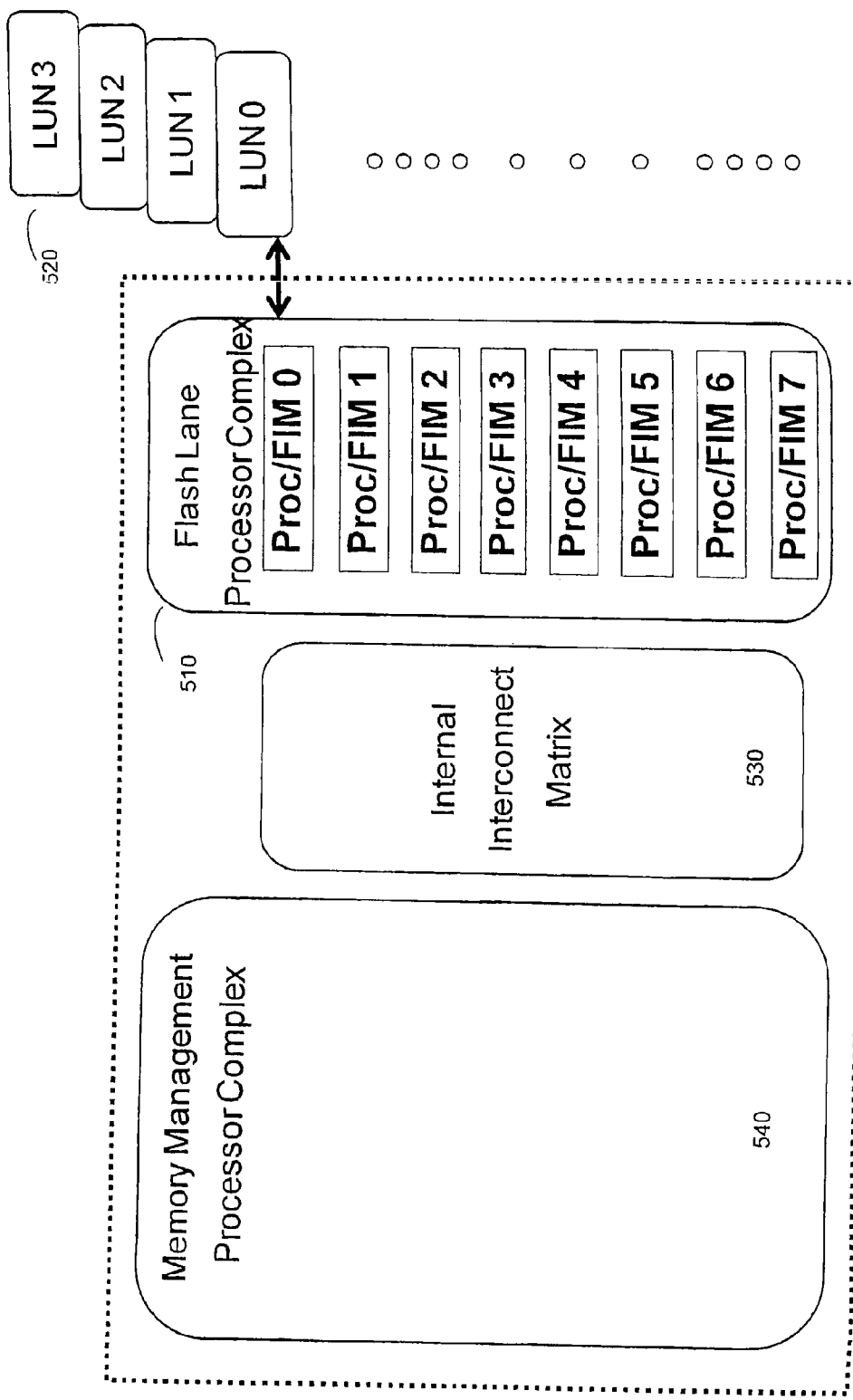
FIG. 5 is a block diagram of an architecture of an embodiment.

It should also be noted that other controller architectures can be used. For example, FIG. 3 illustrates a single chip host-to-flash controller 300. This controller 300 contains a host interface 310 and a plurality of processor/flash interface modules (FIMs) 320. Each of the processor/FIMs is connected to a respective plurality of flash memory devices (LUNs). In another embodiment (shown in FIG. 4), instead of the plurality of processor/FIMs being inside a single controller, each processor/FIM 400 communicates individually with an ONFI channel sequencer 415 in the host controller via respective ONFI lanes. As in FIG. 3, each processor/FIM 400 in this embodiment is connected to a plurality of flash memory devices (LUNs) 420. In yet another embodiment (shown in FIG. 5), the controller contains a flash lane processor complex 510 that contains a plurality of processor/FIMs connected to a plurality of flash memory devices (LUNs) 520. The flash lane processor complex 525 is connected via an internal interconnect matrix 530 to a memory management processor complex 540, that manages the operation of the memory. Of course, these are just examples of some of the architectures that can be used; others can be used. The claims should not be limited to a particular type of architecture unless explicitly recited therein.

The three example architectures above illustrate the variations on how a host platform (PC, laptop, etc.), host interface controller (such as SATA, PCIe, etc.), or simply one or more host processes or execution threads within an integrated storage complex or SOC may produce a plurality of memory storage, memory management, or device maintenance or health operations destined for one or more exemplary Flash Memory controller Lanes, processes, or execution threads.

Now that exemplary controller architectures have been described, the following section provides a discussion of embodiments related to using a transaction flag for page protection.

Embodiments Relating to Using a Transaction Flag for Page Protection

Turning again to the drawings, FIGS. 6A, 6B, and 6C are diagrams illustrating the programming of various memory cells. FIG. 6A diagrammatically shows the programming of a single-level memory cell (SLC) or "X1." As shown in FIG. 6A, with an SLC memory cell, the memory cell stores one bit per cell—either 1 or a 0. As shown in FIG. 6B, with an X2 memory cell, the memory cell stores two bits per cell—either a 11, 10, 01 or 00—and is programmed in two passes: a lower page (LP) and an upper page (UP), where the lower page and the upper page span across a series of memory cells sharing a common word line. Typically, the less significant bit of the two bits of data represents a page bit of a lower page, and the more significant bit of the two bits of data represents a page bit of an upper page. Finally, as shown in FIG. 6C, with an X3 memory cell, the memory cell stores three bits per cell—either 111, 110, 101, 100, 011, 010, 001, or 000—and is programmed in three passes: a lower page (LP), a middle page (MP), and an upper page (UP). Accordingly, X1 memory is programmed using uniform pages across blocks of memory, X2 memory alternates programming between lower and upper pages, and X3 memory sequences programming through lower, middle, and upper pages.

Figure 7:
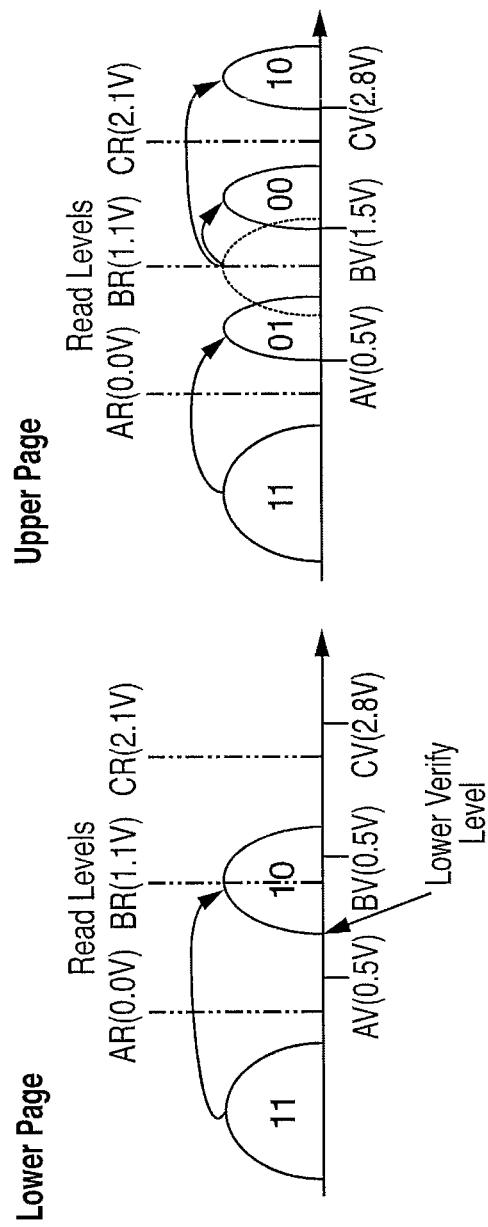
FIG. 7 illustrates charge levels in a MLC memory operated to store two bits of data in a memory cell.

FIG. 7 illustrates one implementation of the four charge levels used to represent two bits of data in an X2 memory cell. A value of "11" corresponds to an un-programmed state of the memory cell. When programming pulses are applied to the memory cell to program a page bit of the lower page, the level of charge is increased to represent a value of "10" corresponding to a programmed state of the page bit of the lower page. For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page. Additional information about MLC programming can be found in U.S. patent application Ser. No. 12/979,686, which is hereby incorporated by reference.

Figures 8, 9:
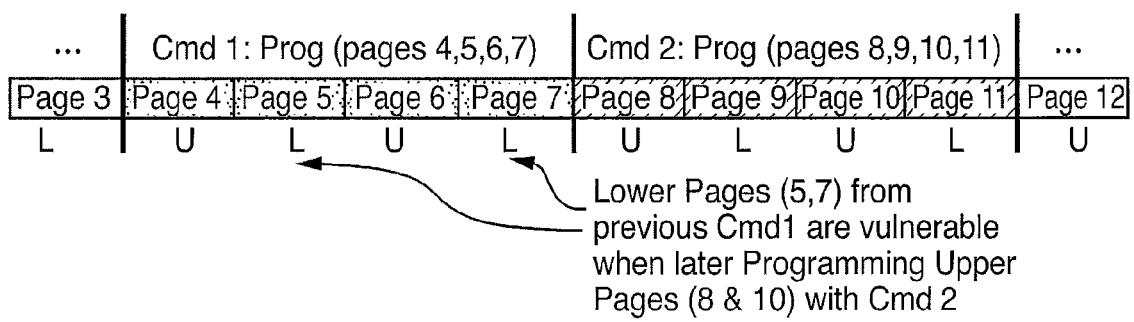
FIG. 8 is an illustration of upper and lower page programming over word lines of an embodiment.
FIG. 9 is an illustration of how a programming failure on an upper page can corrupt a lower page.

For X2 flash memory, one physical wordline (WL) contains two pages, and, typically, the lower page is programmed first, and the upper page is programmed later. To avoid upper and lower page corruption, a reliable programming sequence can be used that staggers adjacent pages, such that the lower page number is three less than the upper page number that shares the same wordline. For example, as shown in FIG. 8, page five is the lower page on wordline three, and page eight is the upper page on wordline three. However, in X2 or X3 flash, a program failure (i.e., when the flash returns a FAIL status on a program operation) that occurs while programming an upper page may also corrupt data on a previously written lower page (or middle page for X3) that is on the same wordline as the upper page. For example, as shown in FIG. 9, for a (Prog Cmd 1); (Prog Cmd 2) sequence, programming failures on upper pages in Cmd 2 can corrupt lower pages from the previous Cmd 1.

Since programming an upper page may corrupt its partner lower page, the data on the lower page is considered vulnerable or "at risk" until the upper page programming has completed successfully. For this reason, storage controllers may elect to preemptively save a back-up copy of this vulnerable data, in the event that it is needed for restoration after a program fail or write abort (i.e., when power is removed at any time during a program or erase operation). So, in the example shown in FIG. 9, page five would be backed up prior to a programming attempt to page eight. Previous approaches to address this MLC program and/or power failure problem involve choices of where to store back-up data (e.g., host RAM, flash controller RAM, flash memory, etc.) and various schemes on when to save data (e.g., never, always, based on host commands, based on flash programming vulnerability, etc.). Where the back-up data is stored affects memory resource usage and bus utilization and determines the added latency of the protection step, and when or how often to save the data determines how often this latency is incurred. For example, storing the data to a RAM buffer requires an extra read operation, and storing the data in flash requires extra read and program operations to the flash. Both of these issues impact the program/write performance that may be achieved. Additionally, storing in RAM (volatile) versus flash (non-volatile) also sets the scope of protection from data loss. While the performance impact is reduced by storing back-up data only to RAM rather than flash, it does not protect against power loss (i.e., write abort). On the other hand, backing up to flash provides protection for both program failures and write aborts.

The type of product also has an impact on this issue. For example, depending on the product, protection may be achieved with a bulk capacitor that supplies enough current to complete a program operation after a power loss. However, if the product is a low-capacity flash memory card with a low-cost flash memory controller, the product may not support program fail handling at all. For example, if the product is a flash card used in a relatively low-cost application (e.g., a digital camera), the host may tolerate loss of data. Also, the double read and/or write operations needed to adequately save the data may be too great of a performance hit for the product.

In contrast to low-capacity flash cards used in relatively low-cost applications, solid state drives (SSDs) have a much higher capacity and greater data integrity requirements. For example, in a typical SATA-based SSD application, a central host controller accesses multiple attached devices (targets/NAND device clusters) on each ONFI channel and across several ONFI channels. This higher capacity means many more flash memory dies need to be protected and managed than in a low-cost card product, and program failure mitigation requires special considerations and new approaches.

Accordingly, there may be special requirements for SSDs. For example, for a program failure, there may be a requirement that no data previously programmed into the block, or being programmed in the failing operation, may be lost. As another example, when an SSD suffers a write abort (power loss), there may be a requirement that any data that was previously written must be intact and recoverable (but any data that is being programmed at the time of a power loss will be lost and not recoverable after power is restored). This means that all data programmed during the handling of the interrupted operation must be reversed, and the data for an incomplete operation will revert to the previous values.

One approach to handling these requirements is through the use of "safe zones." That is, an algorithm can be used to pro-actively copy data from a "risk zone" to a "safe zone" to handle write aborts and program failures. For example, if a write request is to an upper page address, the host can send a read command to the flash memory device(s) for the corresponding lower page and then send a program command to have it copied into a safe zone (a spare scratchpad area) by writing it back to another location in the flash memory device(s). If an error occurs in writing the upper page, the lower page can still be read back from the safe zone and the error corrected. Such safe zones are discussed in more detail in U.S. Pat. No. 6,988,175, which is hereby incorporated by reference. However, one disadvantage to having safe zones be managed by the host is that the host may lack visibility of the NAND technology of the SSD, such as the number of bits/cell and the lower, middle, and upper page information. Having the safe zones be managed by the controller of the SSD avoids this issue, and each target device can store vulnerable data in a hidden X1 area of the device. However, the SSD controller may lack visibility of the transaction type (random, sequential, etc.) of the host.

Because safe zone handling is flash technology/topology dependent and transaction dependent, if technology independence is desired, the host should not have visibility of binary or MLC technology or upper/middle/lower pages information. The virtual flash block topology can be communicated to the host from the controller via an ONFI parameter page, which can specify the number of planes, page size, pages per block, and vulnerable page duration (i.e., the number of subsequent pages that must be programmed to eliminate vulnerability). However, the SSD controller would not know about the host's flushes or sequential runs. On the other hand, host-managed safe zones can be resource intensive if they require vulnerable data to be stored from all attached target MCP's in the host controller, and there can be an extra performance hit because of the multiple NAND die (e.g., 4, 8, 16, . . . ) traffic on shared ONFI data channels.

To overcome these issues, the following embodiments can be used to provide a host controller with a multiple ONFI target-based cooperative-distributed safe zone/vulnerable data management process utilizing compatible address-phase signaling over an ONFI bus. These "distributed safe zones" embodiments offers resource and performance advantages over the host controller-centralized methods discussed above to protect and manage vulnerable user data. In general, the storage device controller receives a command from the host to program data in the multi-level memory cells. The controller detects an indication from the host that previously-programmed data is at risk of being corrupted and backs up the data that is at risk of being corrupted. The indication can be a transaction flag set by the host controller at the beginning of a sequential transfer of data for the duration of the vulnerable data window, or the controller can derive the indication from topology parameters and host controller transaction knowledge. In any event, such an indication allows the host to convey transactional knowledge to the target controller to allow it to preserve vulnerable data until the upper page program on a given wordline has succeeded.

More specifically, the storage device controller of these embodiments receives a command from the host to program data in a plurality of lower pages and a plurality of upper pages of the multi-level memory cells. The controller then detects an indication from the host that indicates which previously-programmed lower pages from a previous program command are at risk of being corrupted by the programming of the upper pages from the received program command. (The indication can also be derived from parameters associated with a region of memory cells being programmed.) Prior to programming the upper pages, the controller backs up the previously-programmed lower pages from the previous program command that are at risk of being corrupted but not the lower pages of data programmed by the received program command (because the host typically would have this data already stored in its buffer as part of the program process). The backed-up pages can be stored, for example, in volatile or non-volatile storage in the controller. These embodiments will now be further illustrated in conjunction with FIGS. 10-13.

FIGS. 10-11 are illustrations of how a transaction flag can be used for page protection in X2 memory. As shown in FIGS. 10 and 11, for X2 memory, if the host is attempting to program an upper page and sets the transaction flag (here, TB) as "true," the controller makes a backup copy of the lower page(s). FIGS. 12-13 are illustrations of how a transaction flag can be used for page protection in X3 memory. As shown in these figures, for X3, if the host is attempting to program an upper page and sets the transaction flag (TB) as "true," the controller makes/keeps a backup copy of the lower and middle page(s). By providing a method of protecting vulnerable page data in an MLC-flash-based SSD, these embodiments can reduce host controller memory resource usage and reduce extra data traffic on the shared ONFI channels. Also, by conveying host transaction knowledge to the target flash MCP, the target may better utilize its buffers with an indication from the host of when a page backup is needed.

Conclusion

It is intended that the foregoing detailed description be understood as an illustration of selected forms that the invention can take and not as a definition of the invention. It is only the following claims, including all equivalents that are intended to define the scope of this invention. Also, some of the following claims may state that a component is operative to perform a certain function or configured for a certain task. It should be noted that these are not restrictive limitations. It should also be noted that the acts recited in the claims can be performed in any order—not necessarily in the order in which they are recited.

What is claimed is:

1. A controller comprising:
    one or more interfaces through which to communicate with a plurality of memory dies, wherein at least some of the plurality of memory dies contain multi-level memory cells operative to be programmed with at least two bits of data;
    an interface through which to communicate with a host; and
    a processor in communication with the one or more interfaces, wherein the processor is configured to:
        receive a command from the host to program data in a plurality of lower pages and a plurality of upper pages of the multi-level memory cells;
        receive an instruction from the host that indicates which previously-programmed lower pages from a previous program command are at risk of being corrupted by the programming of the upper pages from the received program command and need to be backed up; and
        prior to programming the upper pages, back up the previously-programmed lower pages from the previous program command that are at risk of being corrupted, as indicated by the instruction received from the host, but not the lower pages of data programmed by the received program command.

2. The controller of claim 1, wherein the instruction is a transaction flag provided by the host.

3. The controller of claim 1, wherein the instruction is derived from parameters associated with a region of memory cells being programmed.

4. The controller of claim 1, wherein the multi-level memory cells store two-bits per cell.

5. The controller of claim 1, wherein the multi-level memory cells store at least three-bits per cell, and wherein previously-programmed middle pages are also backed up.

6. The controller of claim 1, wherein the previously-programmed lower pages are backed-up in a non-volatile buffer in the controller.

7. The controller of claim 1, wherein the previously-programmed lower pages are backed-up in a volatile buffer in the controller.

8. The controller of claim 1, wherein the controller is part of a solid-state drive.

9. The controller of claim 1, wherein the interface through which to communicate with the host is a flash interface.

10. The controller of claim 9, wherein the flash interface is an Open NAND Flash Interface (ONFI) interface.

11. A method for protecting data, the method comprising:
    performing in a controller comprising one or more interfaces through which to communicate with a plurality of memory dies and an interface through which to communicate with a host, wherein at least some of the plurality of memory dies contain multi-level memory cells operative to be programmed with at least two bits of data:
        receiving a command from the host to program data in a plurality of lower pages and a plurality of upper pages of the multi-level memory cells;
        receiving an instruction from the host that indicates which previously-programmed lower pages from a previous program command are at risk of being corrupted by the programming of the upper pages from the received program command and need to be backed up; and
        prior to programming the upper pages, backing up the previously-programmed lower pages from the previous program command that are at risk of being corrupted, as indicated by the instruction received from the host, but not the lower pages of data programmed by the received program command.

12. The method of claim 11, wherein the instruction is a transaction flag provided by the host.

13. The method of claim 11, wherein the instruction is derived from parameters associated with a region of memory cells being programmed.

14. The method of claim 11, wherein the multi-level memory cells store two-bits per cell.

15. The method of claim 11, wherein the multi-level memory cells store at least three-bits per cell, and wherein previously-programmed middle pages are also backed up.

16. The method of claim 11, wherein the previously-programmed lower pages are backed-up in a non-volatile buffer in the controller.

17. The method of claim 11, wherein the previously-programmed lower pages are backed-up in a volatile buffer in the controller.

18. The method of claim 11, wherein the controller is part of a solid-state drive.

19. The method of claim 11, wherein the interface through which to communicate with the host is a flash interface.

20. The method of claim 19, wherein the flash interface is an Open NAND Flash Interface (ONFI) interface.

\* \* \* \* \*